United States Patent
Purushothaman et al.

(10) Patent No.: US 9,929,885 B2
(45) Date of Patent: Mar. 27, 2018

(54) PHASE TRACKING RECEIVER

(71) Applicant: Stichting IMEC Nederland, Eindhoven (NL)

(72) Inventors: Vijay Kumar Purushothaman, Vellore (IN); Yao-Hong Liu, Eindhoven (NL); Robert Bogdan Staszewski, Delft (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/380,078

(22) Filed: Dec. 15, 2016

(65) Prior Publication Data

US 2017/0180170 A1    Jun. 22, 2017

(30) Foreign Application Priority Data

Dec. 18, 2015  (EP) .................................. 15201303

(51) Int. Cl.
| | |
|---|---|
| *H04L 27/06* | (2006.01) |
| *H03L 7/093* | (2006.01) |
| *H03L 7/10* | (2006.01) |
| *H03L 7/099* | (2006.01) |

(52) U.S. Cl.
CPC .............. *H04L 27/06* (2013.01); *H03L 7/093* (2013.01); *H03L 7/0991* (2013.01); *H03L 7/101* (2013.01)

(58) Field of Classification Search
CPC ..... H03G 3/3052; H04L 7/033; H03L 7/0891; H03L 7/093
USPC ......... 375/345, 308, 329, 373–376; 327/156, 327/157; 455/103, 127, 307
See application file for complete search history.

(56) References Cited

U.S. PATENT DOCUMENTS

| | | | |
|---|---|---|---|
| 4,682,118 A | 7/1987 | Thiel | |
| 2007/0040940 A1* | 2/2007 | Wang | ...................... H03L 7/087 348/536 |
| 2012/0212290 A1* | 8/2012 | Hafuka | ................... H04L 27/14 329/303 |
| 2015/0207502 A1* | 7/2015 | Valliappan | .............. H04L 7/033 375/375 |

FOREIGN PATENT DOCUMENTS

| | | |
|---|---|---|
| EP | 0 168 157 A2 | 1/1986 |
| EP | 0 344 991 A2 | 12/1989 |
| JP | 6-252792 | 9/1994 |

OTHER PUBLICATIONS

European Search Report, European Patent Application No. 15201303.3, dated May 31, 2016, 8 pages.

* cited by examiner

*Primary Examiner* — Khai Tran
(74) *Attorney, Agent, or Firm* — McDonnell Boehnen Hulbert & Berghoff LLP

(57) ABSTRACT

The present disclosure relates to a method for demodulating a modulated signal and a receiver. The receiver comprises: a phase detector with a first and second input, the first input being adapted to receive a modulated input signal; a comparator comprising an input coupled to an output of the phase detector; a frequency-offset cancellation block comprising an input coupled to an output of the comparator. The receiver includes a digitally controlled oscillator comprising: a control input coupled to an output of the comparator and an output of the frequency-offset cancellation block; and an output coupled to the second input of the phase detector.

19 Claims, 2 Drawing Sheets

PHASE TRACKING RECEIVER

CROSS-REFERENCE TO RELATED APPLICATIONS

The present application is a non-provisional patent application claiming priority to European Patent Application No. EP 15201303.3, filed Dec. 18, 2015, the contents of which are hereby incorporated by reference.

FIELD OF THE DISCLOSURE

The present disclosure generally relates to radio receivers, and in particular to a digitally controlled oscillator (DCO)-based phase tracking receiver providing automatic frequency offset cancellation.

BACKGROUND

Constant envelope FSK/PSK modulations are widely adopted in wireless standards like Zigbee and Bluetooth low energy for their low hardware complexity and better immunity to interference. Conventional I/Q based FSK/GFSK receivers employ frequency demodulation techniques like differentiate-and-multiply, zero-crossing detection and quadrature correlation.

These receivers are power-hungry and employ several analog blocks whose performance degrades with technology scaling. Sliding IF based receivers, although they may partially reduce power consumption, are prone to image rejection issues. Phase domain receivers are becoming a better option for ultra-low power and low-voltage radios.

A phase-locked-loop (PLL), in its locked state, maintains a constant phase difference between the oscillator, normally a voltage-controlled oscillator (VCO), output and a reference signal. In other words, the oscillator in the PLL tracks the frequency of the reference signal. This phase/frequency tracking behavior of a PLL can be used for frequency demodulation, and the control signal to the oscillator can be used directly as a demodulated frequency signal for subsequent processing.

VCO-based phase tracking FSK/GFSK receivers use a PLL demodulator either as a separate block at the end of the receiver chain before analog-to-digital converters (ADC) convert the signal into the digital domain, or integrate it together with other receiver blocks like mixers, low pass filters and variable gain amplifiers. In these approaches, an RF input signal is generally down-converted to a suitable intermediate frequency and amplitude limited before passing it to the PLL for demodulation. The control signal of the oscillator in the PLL is then digitized for digital baseband (DBB) processing.

VCO-based phase tracking receivers suffer from a few architectural issues. First, a PLL demodulator employs a free-running oscillator to lock with an input RF signal. Wireless standards allow RF input signals to have a certain amount of dynamic frequency offset during data transmission. These input frequency deviations along with low frequency drift due to frequency instability of the free-running oscillator drastically affect the carrier recovery during demodulation and can result in a high bit error rate. Thus, Phase tracking FSK receivers may have poor frequency deviation tolerance.

Second, strong interferers pull the oscillator away from the desired carrier frequency which results in poor demodulation performance. This can be partially addressed by using high-order channel-selection filters to suppress the interferers. However, a long delay introduced by the high-order filter degrades the demodulation performance and loop stability.

Finally, a high resolution ADC or a high precision threshold detector is needed to discriminate the FSK data.

SUMMARY

In view of the above, some embodiments of the present disclosure include providing a receiver with reduced power consumption, and improved frequency tolerance and interference rejection.

According to a first aspect of the present disclosure, a receiver is provided. The receiver comprises a phase detector with a first and second input, wherein the first input is adapted to receive a modulated input signal. The receiver includes a comparator comprising an input coupled to an output of the phase detector. The receiver includes a frequency-offset cancellation block comprising an input coupled to an output of the comparator. The receiver includes a digitally controlled oscillator comprising a control input coupled to an output of the comparator and an output of the frequency-offset cancellation block, and an output coupled to the second input of the phase detector.

Thus, some embodiments of the present disclosure are based on the idea of providing a receiver with a demodulation loop comprising a comparator, and an automatic frequency-offset cancellation (AFC) loop, both units controlling a DCO in order to reduce power consumption, improve frequency tolerance and interference rejection of the DCO-based phase tracking receiver. The different parts of the receiver (alternately referred to as "unit", "device", "circuit" and/or "element") disclosed below may be implemented in hardware, software or a combination of both. Additionally, the term "integrated" used throughout the description may refer to electronic circuits that are integrated on one or more small plates ("chip") of semiconductor material (normally silicon) or software code portions that are integrated together in a control program which, when run on a processor, provides the functions of each disclosed receiver part.

The term "phase detector" refers to any unit, device, circuit and/or element that is capable of generating an output signal which represents the difference in phase between at least two input signals. The phase detector may be adapted to receive analog signals or square-wave digital signals and produce an output signal representing the difference frequency between the signals. The phase detector may be sensitive only to the relative timing of the edges of the received input signals, and produce an output signal representing the phase difference between the input signals when both signals are at the same frequency.

The term "comparator" refers to any unit, device, circuit and/or element that is capable of comparing the value of an analog or digital input signal with an analog or digital reference value, and providing an output signal indicating whether the value of the input signal is greater, equal or less than the reference value. The reference value may be provided internally in the comparator or provided from an external source at an input of the comparator. The frequency-offset cancellation may be automatic in the sense that the frequency-offset cancellation block during operation may perform its function without intervention by, for example, a user of the receiver. For the sake of simplicity, in the following descriptions of embodiments, the frequency-offset cancellation block will be referred to as an automatic frequency-offset cancellation block (AFC).

The term "digitally controlled oscillator" refers to an oscillator comprising an input for receiving a digital tuning word and adapted to provide a signal at its output, wherein the signal has a frequency which is at least partially determined by the digital tuning word. By way of a generalized example, the digital tuning word may be a logical "1" or a logical "0", wherein the frequency at the output of the digitally controlled oscillator assumes a first frequency when the digital tuning word is "1" and a second frequency when the digital tuning word is "0". Each component of the receiver may be integrated with one or more of the other components of the receiver or may be implemented by means of separate circuitry, software or a combination of both.

In some embodiments, the DCO oscillates at only definite frequencies based on the comparator output, removing the effect of non-linearity in DCO gain. The comparator provides a capture effect and suppresses interference in the received signal. Interference may have its origin in strong signals at higher frequencies, e.g. from adjacent and alternate channels, or in non-ideal characteristics in circuitry through which a signal travels (e.g. a low noise amplifier, LNA preceding the phase detector, the phase detector itself, and/or the DCO). Such non-linear characteristics produce harmonics of the input signal and act as interferers to the desired signal. The AFC loop in negative feedback configuration estimates the frequency deviation due to input frequency offset and oscillator frequency instability and cancels it by modifying DCO's center frequency accordingly. By this arrangement a receiver with reduced complexity, reduced power consumption, improved frequency tolerance and improved interference rejection may be provided.

The input of the comparator may be coupled to the output of the phase detector via a low-pass filter (LPF).

The low-pass filter may be an analog or digital filter. A digital filter comprises or is preceded by an analog-to-digital converter (ADC). The filter may be implemented in many different ways. By way of example the low pass filter may be a passive or active first or higher order RC, RL or LC filter, a switched capacitor filter, a FIR filter or an IIR filter.

The low-pass filter suppresses any signal that lies outside its bandwidth, where the bandwidth of the low-pass filter may be set to be equal to the bandwidth of the input modulating signal. By this arrangement a receiver with a more reliable detection of the input data is achieved since the reduced interference in the signal provided to the comparator facilitates a correct detection of the state/value of the modulation signal. The low-pass filter may be integrated with one or more of the other components of the receiver or may be implemented by means of separate circuitry, software or a combination of both.

The frequency-offset cancellation block may comprise an integrator.

In general, the term "integrator" refers to any unit, device, circuit and/or element that is capable of providing an output signal which represents the time integral of its input signal. The integrator may be a first or higher order IIR or FIR integrator. By way of example, the integrator may be a forward rectangular integrator, a backward rectangular integrator, a trapezoidal integrator or a Simpson integrator. The integrator may be integrated with one or more of the other components of the receiver or may be implemented by means of separate circuitry, software or a combination of both.

In some embodiments, the integrator facilitates an extraction of the undesired low-frequency components from the comparator output which is used to determine the residual frequency error/deviations in the loop.

In some embodiments, the frequency-offset cancellation block may comprise a low-pass tunable finite impulse response (FIR) filter.

In general, the term "tunable FIR filter" refers to any unit, device, circuit and/or element acting as a filter with controllable spectral characteristics, i.e. the filter has a variable cutoff frequency response. The filter may be designed using any suitable design method, e.g. by transformation or spectral parameter approximation. In some examples, the filter is a low-pass FIR filter of length M, where M is selected to provide a suitable frequency response. The filter may be integrated with one or more of the other components of the receiver or may be implemented by means of separate circuitry, software, or a combination of both.

The tunable FIR filter facilitates an extraction of the undesired low-frequency components from the comparator output which is used to determine the residual frequency error/deviations in the loop. The tunable FIR filter makes the AFC block programmable and can be used to meet receiver frequency tolerance set by wireless standards.

The frequency-offset cancellation block may comprise a variable gain amplifier.

In general, the term "variable gain amplifier" refers to any unit, device, circuit and/or element designed to amplify, pass or attenuate a signal provided at its input and provide the processed signal at its output. The variable gain amplifier may be integrated with one or more of the other components of the receiver or may be implemented by means of separate circuitry, software or a combination of both.

By the provision of a variable gain amplifier it is possible to adjust the bandwidth of the AFC loop and thus control the step response of AFC block. The variable gain amplifier makes the AFC block programmable and can be used to meet receiver frequency tolerance set by wireless standards.

The frequency-offset cancellation block may comprise a delta-sigma modulator.

The delta-sigma modulator may be used for quantizing the filtered and amplified digital data into discrete steps that can be fed directly to the DCO. The delta-sigma modulator may be used for improving the resolution of the discrete steps by time averaging. The delta-sigma modulator may be integrated with one or more of the other components of the receiver or may be implemented by means of separate circuitry, software or a combination of both.

By this arrangement a receiver with better frequency tracking properties may be achieved due to the increased frequency resolution of the DCO provided by the delta-sigma modulator.

The integrator, tunable finite impulse response filter, variable gain amplifier and delta-sigma modulator may be sequentially connected.

The term "sequentially connected" refers to the idea that the integrator, tunable finite impulse response filter, variable gain amplifier and delta-sigma modulator may be connected in any order seen from a signal propagation point of view.

By this provision an increased flexibility in implementing the receiver may be achieved.

The frequency-offset cancellation block may be implemented in the digital domain.

The term "digital domain" refers to the idea that the frequency-offset cancellation block is implemented in digital circuitry acting on and providing digital signals. The digital circuitry may be integrated on a single chip or distributed among a plurality of integrated circuits. The single chip may be provided as an integrated circuit. The digital circuitry forming the frequency-cancellation block may be part of a larger chip including circuitry relating to one or more of the other components of the receiver. The integrated circuits forming the frequency-cancellation block and/or the receiver may be assembled on a substrate, such as a printed circuit board. Alternatively, the frequency-offset cancellation block may be implemented in software which, when run on a processor, provides the functions of the frequency-offset cancellation block.

By this arrangement a receiver with fewer analog blocks compared to conventional FSK receivers may be provided. The receiver may thus consume lesser power and may be implemented using a minimal chip/substrate area.

The comparator may be adapted to provide a digital signal to the control input of the digitally controlled oscillator, wherein the digitally controlled oscillator may be adapted to provide a signal of a first or a second frequency at its output based on the digital signal.

In some embodiments, the oscillator is adapted to provide an output signal of a first and second frequency which complies with the specific communication standard by which the receiver operates. By way of example, if the receiver is to be used for BLUETOOTH™ communication, the receiver may receive signals transmitted over a specific channel, wherein the first and second frequency are selected based on the specific channel within the BLUETOOTH™ standard, i.e. the channel frequencies are all located within the 2.4 GHz ISM band and the frequency of the carriers in the channels are shifted to carry the modulation. A binary one is represented by a positive frequency deviation and a binary zero is represented by a negative frequency deviation. Typically the modulation index may vary between 0:28 and 0:35 giving a frequency deviation between 0.140 MHz and 0.175 MHz from the carrier.

Since the oscillator is adapted to provide an output signal of a first or a second frequency based on the signal provided by the comparator, the effects of any non-linearity in the DCO gain and thereby the oscillator frequency is avoided.

The control input of the digitally controlled oscillator may be coupled to the output of the comparator and the output of the automatic frequency-offset cancellation block via a summation point.

In general, the term "summation point" refers to any unit, device, circuit and/or element designed to receive input data from two or more sources and provide output data representing the sum of the two or more input data streams. In particular, the summation point may provide a summation of two or more serial or parallel data streams received at its input. The summation point may be integrated with one or more of the other components of the receiver or may be implemented by means of separate circuitry, software or a combination of both.

By the provision of a summation point, the AFC loop, demodulation loop and RF front end may share many of the components in the receiver. Thus a compact receiver with reduced power consumption may be provided.

The signal at the input of the comparator has a first frequency, and the comparator is adapted to sample the signal at a second, higher frequency.

The comparator is adapted to sample the LPF output at a frequency higher than bit rate of the modulation signal. That is, the comparator employs oversampling of the LPF signal with a sampling frequency significantly higher than the Nyquist rate.

The oversampling improves the resolution, reduces noise and helps avoid aliasing and phase distortion by relaxing the LPF performance requirements.

The comparator is adapted to provide a demodulated output signal.

The term "output signal" refers to the idea that the comparator output is used for further data processing in the digital domain. Additional circuitry and/or software may be provided for pulse shaping (i.e. changing the waveform of the output signal) and/or adapting (e.g. amplifying, filtering, etc.) the output signal from the comparator before feeding it to subsequent processing circuitry.

By providing a demodulated signal from the comparator a less complex, compact and efficient receiver may be provided.

The input signal may be a frequency-shift key modulated (FSK) signal or a phase-shift key modulated (PSK) signal.

In general the receiver may be adapted to receive and demodulate any FSK/PSK signal. In particular, the receiver may be adapted to demodulate any signal with constant envelope and binary frequency modulation. Such signals include Gaussian Frequency Shift Keying (GFSK), Binary Frequency Shift Keying (BFSK), Offset Quadrature Phase Shift Keying (HS-OQPSK) and Gaussian Minimum Shift Keying (GMSK).

Due to the widespread use of FSK/PSK in modern communications, by this provision, a receiver suitable for use within a wide range of applications may be provided.

According to a second aspect of the present disclosure, a method for demodulating a received modulated signal is provided. The method comprises receiving the modulated signal at an input of a phase detector and providing an output from the phase detector to an input of a comparator. The method comprises comparing the input of the comparator with a threshold and providing an output of the comparator to a control input of a digitally controlled oscillator and to an input of a frequency-cancellation block. The method comprises providing an output of the frequency-cancellation block to the control input of the digitally controlled oscillator, and providing an output of the digitally controlled oscillator to the phase comparator.

Other objectives, features and aspects of the present disclosure will appear from the following detailed disclosure, from the attached claims as well as from the drawings.

Generally, all terms used in the claims are to be interpreted according to their ordinary meaning in the technical field, unless explicitly defined otherwise herein. All references to "a/an/the element, device, component, means, step, etc" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE FIGURES

The above, as well as additional objects, features and embodiments of the present disclosure, will be better understood through the following illustrative and non-limiting detailed description of preferred embodiments of the present disclosure, with reference to the appended drawings, where the same reference numerals will be used for similar elements, wherein.

DETAILED DESCRIPTION

Figure 1:
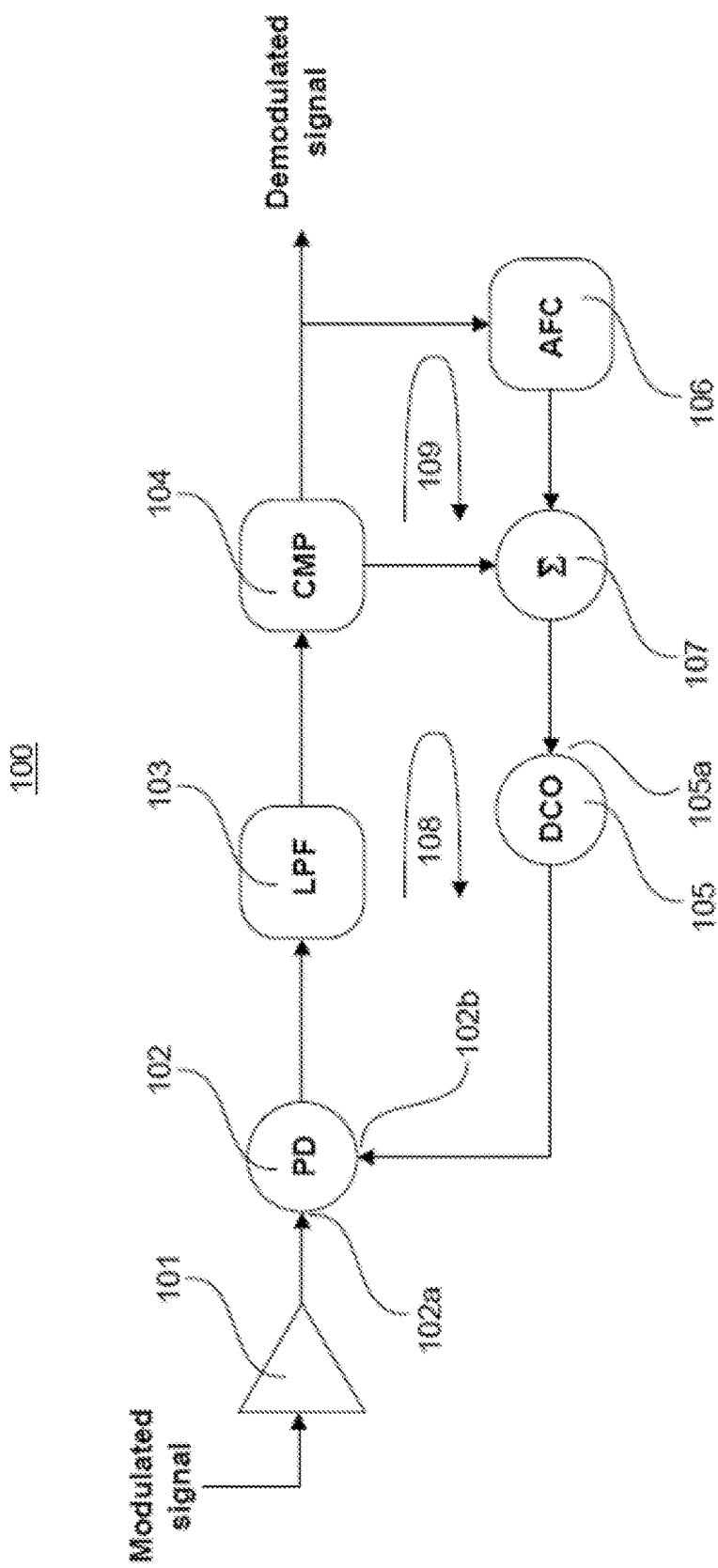
FIG. 1 diagrammatically illustrates a PLL based phase tracking receiver according to an embodiment of the present disclosure.

FIG. 1 illustrates a PLL based phase tracking receiver 100 according to an embodiment of the present disclosure. A FSK/PSK modulated signal is received at an input of the receiver. In an example embodiment, the received modulated signal is amplified by a low-noise amplifier 101 in order to provide a signal of sufficient amplitude to the subsequent functional blocks of the receiver 100. The bandwidth of the low-noise amplifier 101 is set such that it provides sufficient amplification in the bandwidth of interest, which in some examples includes the 2.4 GHz ISM band extending from 2400 MHz to 2483.5 MHz.

A phase detector, PD, 102 comprising a first 102a and second 102b input receives the output from the optional low-noise amplifier 101 at its first input 102a. According to some embodiments, a mixer is used as an analog phase detector 102 and outputs signal proportional to a phase difference between the signals at its inputs 102a, 102b. According to some embodiments, an analog multiplier or logic circuitry may be used as phase detector 102.

The output from the phase detector 102 is forwarded to a low-pass filter, LPF, 103. The LPF 103 suppresses interfering signals in the input signal. Interfering signals at the input of the LPF 103 normally have two sources: 1) from the input of the receiver—strong signals at higher frequencies, usually from adjacent and alternate channels, interfere with the desired signal, and 2): non-ideal characteristics in the circuitry of the receiver—e.g. the low-noise amplifier 101, the phase detector 102 and/or other parts of the receiver 100 may produce harmonics of the input signal, which act as interferers to the desired signal. The LPF 103 suppresses any signal that lies outside its bandwidth, where the bandwidth of LPF 103 may be set to be equal to the bandwidth of the input modulated signal.

In some embodiments, the output from the LPF 103 is forwarded to a comparator, CMP, 104 which may sample the output of the LPF 103 at a frequency higher than the bit rate of the modulating signal. A capture effect exhibited by comparator 104 provides extra interference suppression, i.e. the comparator 104 responds to the instantaneous amplitude of the input signal. If the ratio of interference signal to desired signal is below a certain factor, then instantaneous amplitude of the comparator 104 input will be dominated by desired signal. The comparator 104 may only respond to the polarity of the signal at the LPF 103 output, which mitigates amplitude dependency, and thus relaxes the receiver 100 gain control and makes demodulation loop 108 insensitive to any amplitude fluctuation (e.g., analog gain variation or channel fading). The output from the comparator 104 represents the demodulated signal and is used for further data processing in the digital domain. The comparator 104 is clocked at a frequency higher than the bit-rate, thereby producing 1-bit oversampled digital output without requiring an extra ADC for providing threshold detecting.

The output from the comparator 104 is forwarded to a digitally controlled oscillator, DCO, 105. The DCO 105 oscillates at only definite frequencies based on the comparator 104 output thus removing the effect of non-linearity in the gain of the DCO 105. For example, in a BFSK application the oscillator 105 output is one of two pre-determined frequencies corresponding to the mark and space frequencies in the BFSK scheme. The 1-bit comparator 104 output determines the oscillator frequency in the next sampling period by providing a digital tuning word at an input 105a of the DCO 105. The format of the digital tuning word may vary based on the implementation of the DCO 105.

By way of example, in its simplest form the digital tuning word may be a logical "1" or a logical "0", wherein the frequency at the output of the DCO 105 assumes a first frequency when the digital tuning word is "1" and a second frequency when the digital tuning word is "0". Alternatively, the DCO 105 is adapted to receive a digital tuning word in a frame format which allows dynamic pulling of the frequency of the DCO 105 around a nominal value dynamically. The input 105a of the DCO 105 may be a serial interface which receives a data frame for writing one or more registers (not shown) in the DCO 105. The value(s) written to the register(s) may control the amount of frequency pull from the nominal frequency.

The output of the DCO 105 is provided to the second input 102b of the phase detector 102.

In some embodiments, the DCO 105 comprises an LC tank (not shown) including a number of capacitors of different values. The DCO 105 is adapted to connect one or more of the capacitors in the LC tank based on the digital tuning word. The number of capacitors in the LC tank may vary depending on the resolution needed for the DCO 105.

In an alternative embodiment, a multi-bit ADC may be used in the place of the 1-bit comparator. In this embodiment, the output of the multi-bit ADC controls the DCO 105 to oscillate at more than two frequencies such that the receiver may also demodulate M-ary frequency shift keying (M-FSK) modulation schemes.

Unwanted frequency deviations (e.g. frequency drift of DCO 105) mostly occupy the low frequency region in the spectrum of comparator 104 output. A negative feedback loop 109 via an automatic frequency-offset cancellation, AFC, block 106 cancels the low frequency components in comparator output 104. The AFC loop 109 in negative feedback configuration estimates the frequency deviation due to input frequency offset and oscillator's frequency instability and cancels it by modifying DCO's 105 center frequency accordingly.

In some embodiments the output from the comparator 104 and the AFC block 106 are merged in a summation point 107. That is, the digital data provided by the comparator 104 and the AFC block 106 are merged into a format suitable for controlling the DCO 105. Normally, the comparator 104 will provide data that causes the DCO 105 to increase/decrease its frequency in a larger step such that the DCO 105 follows the mark and space frequencies of e.g. a BFSK scheme. The AFC block 106 will normally provide data that causes the DCO 105 to increase/decrease its frequency in much smaller steps in order to compensate for any frequency offset present in the input signal. The summation point may be implemented in the DCO 105 such that the DCO 105 either has two inputs for receiving the signals from the comparator 104 and AFC block 106, or such that the DCO 105 has one input and receives the data from the comparator 104 and the AFC block 106 sequentially (i.e. combining their contribution internally in the DCO 105, e.g. by adjusting the digital tuning word in one or more registers controlling the frequency of the DCO 105).

The AFC loop 109 shares the PD 102, LPF 103, comparator 104 and DCO 105 with main demodulator loop 108. In some embodiments, the additional AFC block 106 in the AFC loop 109 is implemented in the digital domain in order to make the AFC loop 109 easier to implement and more power efficient.

Figure 2:
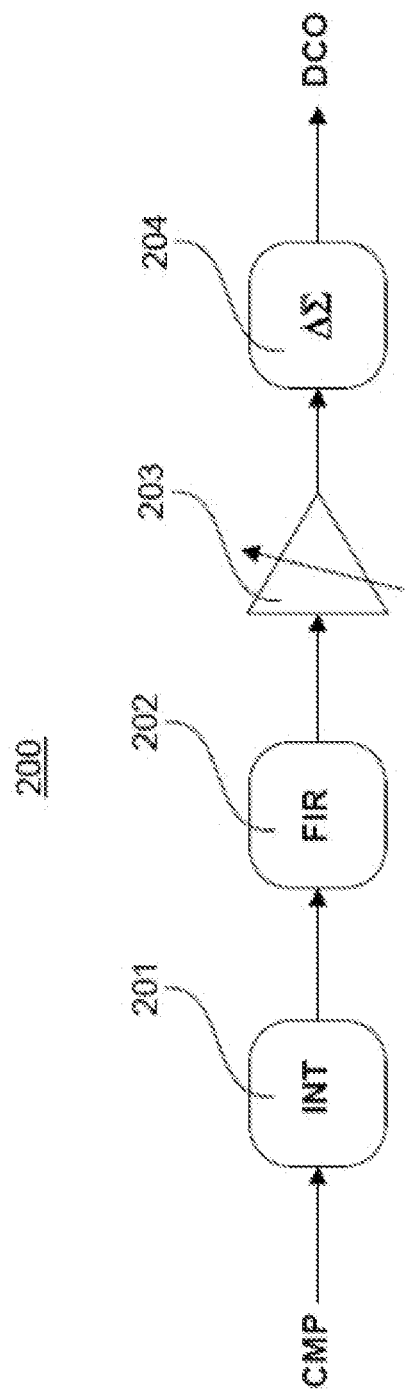
FIG. 2 diagrammatically illustrates a frequency-offset correction block according to an embodiment of the present disclosure.

FIG. 2 illustrates an automatic frequency-offset correction block, AFC, 200 according to an embodiment of the present disclosure. The AFC block 200 includes an integrator 201, a tunable FIR filter 202, variable gain amplifier 203 and a delta-sigma modulator 204.

The integrator 201 and the tunable FIR filter 202 are used to extract the low-frequency undesired components from the comparator 104 output and determine the residual frequency error/deviations in the loop 109.

The variable gain amplifier 203 is used to adjust the bandwidth of the AFC loop 109 and thus determines the step response of AFC block 200. That is, the tunable FIR filter 202 and variable gain amplifier 203 may make the AFC block 200 programmable and can be used to meet receiver frequency tolerance set by wireless standards (e.g. Bluetooth™).

The delta-sigma modulator 204 is used to quantize the filtered and amplified digital data into discrete steps that can be fed directly to the DCO 105. The delta-sigma modulator 204 improves the resolution of these discrete steps by time averaging. More specifically, from a functional point of view the delta-sigma modulator performs two operations: 1) time averaging/dithering—usually the minimum DCO 105 frequency step possible is limited by smallest capacitor in the LC tank; using the delta sigma modulator 204, this smallest frequency step can be further reduced; or in other words, it increases the DCO frequency resolution, and 2) it pushes the quantization noise produced in the AFC 200 to higher frequencies, which in turn will be suppressed by the demodulator loop 108.

As disclosed above, a receiver adapted to provide a demodulated output signal in response to an FSK/PSK modulated input signal has been disclosed. The receiver includes a phase-locked loop comprising a digitally controlled oscillator and adapted to respond to the modulated input signal to provide the demodulated output signal. The receiver further comprises a frequency-offset cancellation block adapted to provide a digital tuning word (or signal) to the digitally controlled oscillator, wherein the digitally controlled oscillator is adapted to respond to the digital tuning word (signal) and change its frequency based on the digital tuning word, and wherein the frequency-cancellation block is adapted to provide the digital tuning word based on the demodulated output signal.

The present disclosure has mainly been described above with reference to a few embodiments. However, as is readily appreciated by a person skilled in the art, other embodiments than the ones disclosed above are equally possible within the scope of the present disclosure, as defined by the appended patent claims.

The invention claimed is:

1. A receiver comprising:
   a phase detector comprising a first input and a second input, the first input being adapted to receive a modulated input signal, wherein the phase detector detects a carrier phase difference between the first and second input;
   a comparator comprising an input coupled to an output of the phase detector; and
   a frequency-offset cancellation block comprising an input coupled to an output of the comparator, wherein the frequency-offset cancellation block comprises an integrator, and wherein the frequency-offset cancellation block cancels a frequency difference between the modulated input signal and a digitally controlled oscillator, wherein the digitally controlled oscillator comprises:
   (1) a control input coupled to the output of the comparator and an output of the frequency-offset cancellation block, and
   (2) an output coupled to the second input of the phase detector.

2. The receiver of claim 1, wherein the input of the comparator is coupled to the output of the phase detector via a low-pass filter.

3. The receiver of claim 1, wherein the frequency-offset cancellation block further comprises a low-pass tunable finite impulse response filter.

4. The receiver of claim 1, wherein the frequency-offset cancellation block further comprises a variable gain amplifier.

5. The receiver of claim 1, wherein the frequency-offset cancellation block further comprises a delta-sigma modulator.

6. The receiver of claim 1, wherein the frequency-offset cancellation block further comprises:
   a low-pass tunable finite impulse response filter;
   a variable gain amplifier; and
   a delta-sigma modulator.

7. The receiver of claim 6, wherein the integrator, tunable finite impulse response filter, variable gain amplifier and delta-sigma modulator are sequentially connected.

8. The receiver of claim 1, wherein the frequency-offset cancellation block is implemented in a digital domain.

9. The receiver of claim 1, wherein:
   the comparator is adapted to provide a digital signal to the control input of the digitally controlled oscillator, and
   the digitally controlled oscillator is adapted to provide a signal of a first or a second frequency based on the digital signal at the output of the digitally controlled oscillator.

10. The receiver of claim 1, wherein the control input of the digitally controlled oscillator is coupled to (i) the output of the comparator and (ii) the output of the frequency-offset cancellation block via a summation point.

11. The receiver of claim 1, wherein a signal at the input of the comparator has a first frequency, and the comparator is adapted to sample the signal at the input of the comparator at a second frequency that is higher than the first frequency.

12. The receiver of claim 1, wherein the comparator is adapted to provide a demodulated output signal.

13. The receiver of claim 1, wherein the modulated input signal is a frequency-shift key modulated signal or a phase-shift key modulated signal.

14. A method for demodulating a modulated signal, comprising:
   receiving the modulated signal at an input of a phase detector having a first and second input,
   providing an output from the phase detector to an input of a comparator;
   comparing the input of the comparator with a threshold;
   providing an output of the comparator to (i) a control input of a digitally controlled oscillator and (ii) to an input of a frequency-cancellation block;
   providing an output of the frequency-cancellation block to the control input of the digitally controlled oscillator, wherein the output of the frequency-cancellation block is provided using an integrator; and
   providing an output of the digitally controlled oscillator to the phase detector.

15. The method of claim 14, wherein the output from the phase detector is provided to the input of a comparator via a low-pass filter.

16. The method of claim 14, wherein the output of the frequency-cancellation block is further provided using a low-pass tunable finite impulse response filter, a variable gain amplifier, and a delta-sigma modulator.

17. The method of claim 16, wherein the integrator, low-pass tunable finite impulse response filter, variable gain amplifier, and delta-sigma modulator are sequentially connected.

18. The method of claim 14, wherein the frequency-cancellation block is implemented in a digital domain.

19. The method of claim 14, wherein a signal at the input of the comparator has a first frequency, and the comparator is adapted to sample the signal at the input of the comparator at a second frequency that is higher than the first frequency.

\* \* \* \* \*